ELECTRICAL ANALOG-TO-DIGITAL CONVERTER

Filed April 28, 1953

INVENTOR.
ROBERT ROYCE BENNETT,
BY Nicholas T Volk
his ATTORNEY.

United States Patent Office 2,896,198

Patented July 21, 1959

2,896,198

ELECTRICAL ANALOG-TO-DIGITAL CONVERTER

Robert Royce Bennett, Los Angeles, Calif., assignor by mesne assignments, to Hughes Aircraft Company, a corporation of Delaware Application April 28, 1953, Serial No. 351,659

2 Claims. (Cl. 340—347)

Figure 1:
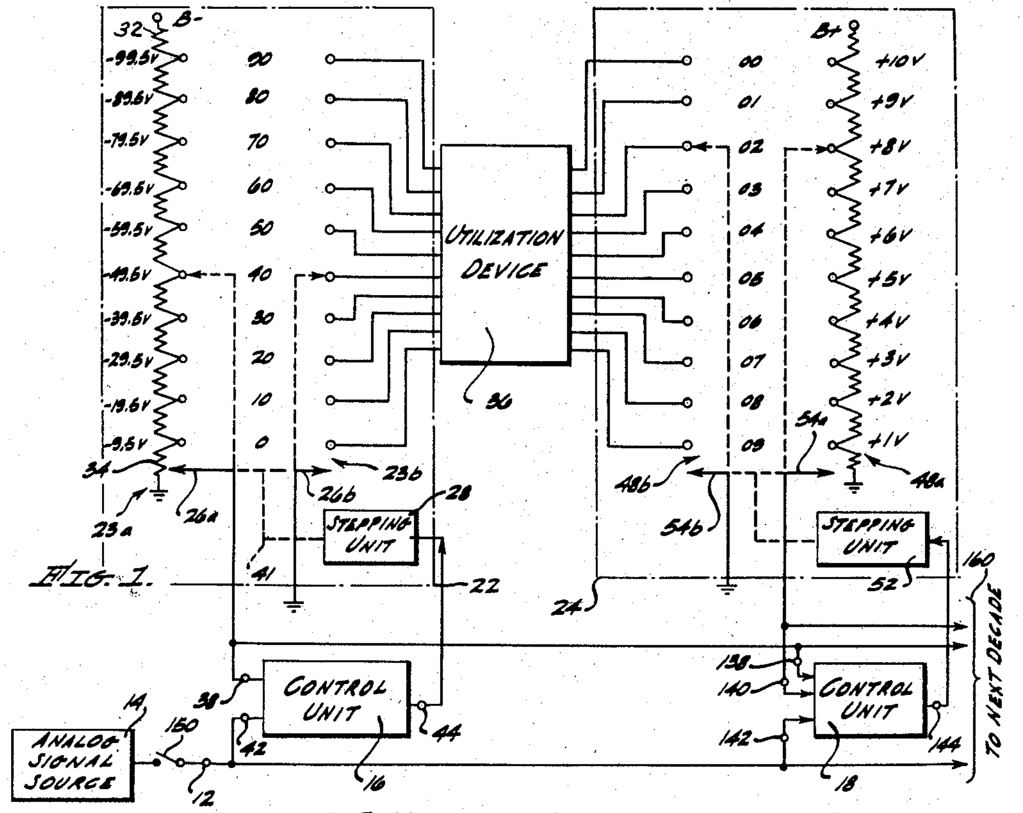

This invention relates to a high speed analog-to-digital converter and more particularly to a high speed analog-to-digital converter for directly converting an applied electrical analog signal into a plurality of discrete switch positions corresponding to the decade digits of the decimal equivalent of the analog signal.

In numerous electrical systems and especially in automatic electrical control systems, it is often necessary to selectively control the system components in accordance with the amplitude of an applied electrical analog signal. More specifically, it is the general practice to convert the applied electrical analog signal into a corresponding plurality of discrete switch positions, and to utilize the switch positions to selectively control the associated system components.

According to one prior art analog-to-digital converter the analog signal is first converted to a discrete shaft position in an electronic servo system. This discrete shaft position is, in turn, converted to a plurality of discrete switch positions by positioning a corresponding plurality of cascaded carry-propagating selector switches, one selector switch being provided for each decade of the decimal equivalent of the analog signal. Briefly stated, each carry-propagating selector switch is stepped one terminal, or in other words, one digit, for each complete revolution of the selector switch corresponding to the next lower decade.

One inherent disadvantage of this prior art analog-to-digital converter is that it is a relatively slow speed device. For example, in order to indicate the decimal digit $n$ in the highest decade of a converter having $m$ decades, the selector switch corresponding to the units decade must complete at least $n \times 10^{(m-2)}$ revolutions. Still another disadvantage of this prior art converter is that the lower decade selector switches are subjected to excessive wear by the carry-propagating operation of the device. In addition, the accuracy of this prior art converter is inherently limited by the intermediate conversion of the analog signal to a shaft position in the associated servo system.

The present invention, on the other hand, obviates the above and other disadvantages of the prior art converter by providing a relatively inexpensive and high speed analog-to-digital converter which is operable to directly convert an applied analog signal to a plurality of discrete switch positions corresponding to the decade digits of the decimal equivalent of the analog signal. According to the fundamental concept of the present invention, each selector switch includes a sensing element movable to one of ten discrete positions under the direct control of an associated control unit. More particularly, each selector switch includes means for generating ten discrete potentials corresponding to the ten switch positions, the control unit operating to move the sensing element until the generated potential and the analog signal have a predetermined relationship.

In operation, the control unit associated with the higher order selector switch compares the potential generated by the switch with the analog signal and moves the sensing element of the switch until the algebraic sum of the generated potential and the analog signal changes sense with respect to a predetermined voltage level. On the other hand, each lower order control unit compares the potential generated by its associated selector switch with the algebraic sum of the analog signal and the potentials generated by all of the higher order selector switches and moves the sensing element of its associated switch in accordance with the magnitude of the compared potentials. By arranging successive control units to be responsive to opposite senses of the algebraic sum of the voltages being compared, the selector switches are positioned sequentially from the highest decade down to the lowest decade, each selector switch being positioned individually and directly to the switch position corresponding to the decimal digit to be represented. In this manner, the analog signal is converted to its corresponding switch positions at high speed, with a minimum amount of wear and without employing any disadvantageous intermediate conversions. The resulting switch positions may then be utilized to selectively actuate an output circuit or a utilization device.

It is, therefore, an object of this invention to provide a high speed analog-to-digital converter for selectively actuating an output circuit in accordance with the amplitude of an applied elecrical analog signal.

Another object of this invention is to provide an analog-to-digital converter for converting an applied electrical analog signal directly to the decimal equivalent of the analog signal.

An additional object of this invention is to provide a high speed analog-to-digital converter for converting an applied electrical analog signal directly to a plurality of discrete positions corresponding respectively to the decade digits of the decimal equivalent of the analog signal.

Still another object of the invention is to provide a relatively high speed analog-to-digital converter for converting an applied electrical analog signal to a plurality of discrete selector switch positions corresponding to the successive decade digits of the decimal equivalent of the analog signal, each selector switch being positioned independently of the other selector switches.

It is also an object of this invention to provide a high speed analog-to-digital converter for selectively actuating an output circuit in accordance with the amplitude of an applied electrical analog signal by sequentially converting the analog signal to a plurality of discrete switch positions corresponding to the decade digits of the decimal equivalent of the analog signal.

The novel features which are believed to be characteristic of this invention, both as to its organization and method of operation, together with further objects and advantages thereof, will be better understood from the following description considered in connection with the accompanying drawings in which one embodiment of the invention is illustrated by way of example. It is to be expressly understood, however, that the drawings are for the purpose of illustration and description only and are not intended as a definition of the limits of the invention.

Figure 2:
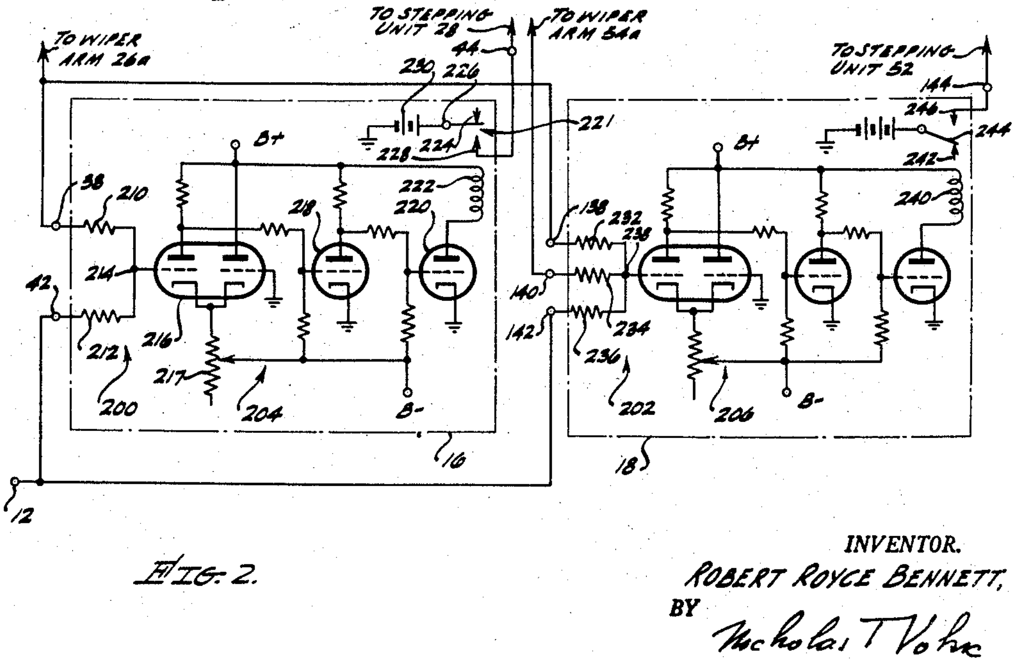

Fig. 1 is a schematic diagram, partly in block form, of the analog-to-digital converter according to the present invention; and Fig. 2 is a schematic diagram of electrical control circuits which may be utilized in the analog-to-digital converter shown in Fig. 1.

Referring now to the drawings, there is shown in Fig. 1 an analog-to-digital converter according to the present invention for converting an electrical analog signal, applied to an input terminal 12 from an analog signal source 14. to a plurality of discrete switch positions corresponding to the decade digits of the decimal equivalent of the analog signal. Basically, the analog-to-digital converter of the present invention comprises a plurality of control units, such as control units 16 and 18, and a corresponding plurality of respectively associated selector switches, such as selector switches 22 and 24.

Each selector switch is utilized to present one decade of the decimal equivalent of the analog signal to be converted. Thus, the number of selector switches utilized in the analog-to-digital converter of the present invention is determined by the number of decades required to express the decimal equivalent of the applied analog signal to the desired accuracy. In order to most clearly describe the present invention, it will be assumed that the analog-to-digital converter shown in Fig. 1 is to be utilized for converting to the nearest units digit a positive electrical analog signal whose magnitude is between 0 and 100 volts. Accordingly, the switch positions of selector switches 22 and 24 correspond to the tens and units digits, respectively, of the decimal equivalent of the applied analog signal.

Each of selector switches 22 and 24 includes a sensing element movable to any one of ten switch positions corresponding to the decimal digits zero to nine, respectively, a stepping unit for moving the sensing element, and means for generating ten discrete potentials corresponding respectively to the ten positions of the sensing element. Several conventional rotary selector switches which are suitable for use with the present invention are shown in Figs. 9–1 and 9–3 of the volume entitled "The Design of Switching Circuits" by Keister, Ritchie and Washburn, published in 1951 by D. Van Nostrand Co., Inc. of New York.

More specifically, as shown in Fig. 1, selector switch 22 includes at least two banks of contacts, generally designated 23*a* and 23*b*, each bank having ten switch positions or levels, designated 0, 10, . . ., 80 and 90, respectively, and corresponding to tens digits, 0, 1, . . ., 8 and 9. In addition, switch 22 includes two sensing elements, such as wiper arms 26*a* and 26*b*, mechanically coupled together and associated with contact banks 23*a* and 23*b*, respectively. Wiper arms 26*a* and 26*b* are normally positioned below and out of engagement with the contacts of their associated contact banks and are movable upon energization of an associated stepping unit 28 to progressively step across their associated contact banks in an upward direction, as viewed in Fig. 1.

Each contact in bank 23*a* is connected to each of the adjacent contacts in the same bank through a resistor. In addition, the uppermost contact in bank 23*a* is connected to one terminal B— of a source of negative potential, not shown, through a resistor 32, while the lowermost contact of contact bank 23*a* is conected to ground through a resistor 34. The source of negative potential, resistors 32 and 34, and all of the intermediate resistors associated with contact bank 23*a* constitute the potential generating means of selector switch 22 and present ten discrete predetermined voltage levels at the ten contacts in the contact bank. Under the assumption that the analog-to-digital converter is to be utilized for converting an analog signal to two switch positions corresponding to the tens and units digits of the decimal equivalent of the analog signal, the value of the resistors associated with bank 23*a* are preferably selected to present at the contacts in the bank the voltages shown to the left of the contacts, as viewed in Fig. 1.

Each contact in bank 23*b* of switch 22, on the other hand, is connected to an associated input terminal of a utilization device 36 which is to be selectively actuated in accordance with the digital equivalent of the analog signal to be converted. Utilization device 36 may, for example, be a printing machine, a card punching apparatus or any other output circuit.

Wiper arms 26*a* and 26*b* of switch 22 are connected to a first input terminal 38 of control unit 16 and to ground, respectively. The mechanical intercoupling of wiper arms 26*a* and 26*b* with stepping unit 28 is indicated by the dotted line 41.

Control unit 16 includes a second input terminal 42 connected to input terminal 12, and an output terminal 44 connected to stepping unit 28. The function of control unit 16 is to energize stepping unit 28 whenever the algebraic sum of the potentials applied to input terminals 38 and 42 is above a predetermined voltage level. More specifically, when the analog-to-digital converter of the present invention is placed in operation, control unit 16 energizes selector switch 22 to step until wiper arm 26*a* engages a terminal in contact bank 23*a* at which the absolute magnitude of the voltage presented is larger than the absolute magnitude of the applied analog signal. Stated differently, control unit 16 will energize selector switch 22 whenever the sum of the voltages applied at input terminals 38 and 42 is positive with respect to the predetermined voltage level, which will hereafter be assumed to be ground potential. One typical circuit which may be utilized in control unit 16 will be described later with reference to Fig. 2.

Referring again to Fig. 1, it will be noted that selector switch 24 is similar to selector switch 22 in that it includes two contact banks, generally designated 48*a* and 48*b*, respectively, associated wiper arms 54*a* and 54*b*, respectively, and a stepping unit 52 mechanically coupled to the wiper arms.

The contacts in contact tank 48*a* are interconnected through an impedance network to ground and to one terminal B+ of a source of positive potential, not shown, in order to present ten discrete predetermined voltage levels at the ten contacts in the 10 contact bank. Assuming that selector switch 24 is being utilized for presenting the units digit of the decimal equivalent of the applied analog signal, the values of the resistors interconnecting the contacts in contact bank 48*a* are preferably selected to produce at these contacts the voltage levels shown immediately to the right of these contacts, as viewed in Fig. 1.

Control unit 18 includes an output terminal 144 and first, second and third input terminals, 138, 140, and 142, which are connected to wiper arm 26*a* of selector switch 22, to wiper arm 54*a* of selector switch 24 and to input terminal 12, respectively. Output terminal 144 is connected to stepping unit 52 in its associated selector switch. Broadly stated, the function of control unit 18 is to energize stepping unit 52 whenever the algebraic sum of the voltages applied at input terminals 138, 140 and 142 is negative with respect to ground. In other words, control unit 18 will energize selector switch 24 to progressively step its associated wiper arms whenever the absolute magnitude of the potential difference between the analog signal voltage and the potential at wiper arm 26*a* of selector switch 22 is greater than the absolute magnitude of the voltage presented at wiper arm 54*a* of selector switch 24.

It will be noted that the ten levels of contact banks 48*a* and 48*b* are designated 09, 08, . . ., 01, and 00, respectively, in descending order, corresponding to the units digits, 9, 8 . . . 1, and 0, respectively. The reason for arranging these levels in descending order may be found in the basic philosophy of the analog-to-digital converter of the present invention. It may be recalled that control unit 16 functions to step selector switch 22 in a count-up manner until wiper arm 26*a* engages a contact in bank 23*a* which presents a voltage level of higher absolute magnitude than the magnitude of the analog signal. It is clear, therefore, that when selector switch 22 has completed its stepping function, the sum of the analog signal voltage and of the potential on wiper arm 26*a* is a voltage negative with respect to ground and has a magnitude less than 10 volts.

It may also be recalled that when selector switch 24 is energized to step off the units digits, it functions to step until a contact terminal is reached whereat the positive voltage presented is larger in absolute magnitude than the absolute magnitude of the potential difference between the applied analog signal and the voltage presented at wiper arm 26a. Thus, it may be seen that the analog-to-digital converter of the present invention energizes selector switches 22 and 24 to step to contacts which present voltages, the sum of which is substantially equal in magnitude to the applied analog signal, but of opposite polarity. Furthermore, since selector switch 22 steps until the voltage presented on wiper arm 26a is of larger absolute magnitude than the magnitude of the applied analog signal, it is clear that selector switch 24 must count-down in order to achieve substantial equality between the sum of the voltages presented at wiper arms 26a and 54a and the analog signal voltage applied at input terminal 12.

The above conditions for energization of selector switches 22 and 24 may be stated more distinctly by the following inequalities:

Energize 22 only when $X+>0$ volts (1);
Energize 24 only when $[X+Y]+Z<0$ volts (2);

where $X$=magnitude of the analog signal with respect to ground;
$Y$=potential with respect to ground applied to wiper arm 26a;
$Z$=potential with respect to ground applied to wiper arm 54a.

In order to more clearly describe the operation of the analog-to-digital converter of the present invention, it will be assumed that a positive analog signal of substantially constant amplitude is applied to input terminal 12 upon closure of a switch 150 interconnecting analog signal source 14 and input terminal 12. In addition, it will be assumed that selector switches 22 and 24 are in their normal positions or, in other words, that wiper arms 26a, 26b, 54a and 54b are positioned below and out of engagement with their associated contact banks, as viewed in Fig. 1.

In operation, closure of switch 150 applies the analog signal from source 14 to input terminals 42 and 142 of control units 16 and 18, respectively. Simultaneously with the closure of switch 150, no potential is applied to either wiper arm 26a or wiper arm 54a, since their associated selector switches are still in their normal positions. Accordingly, it is clear from inequality (1) that control unit 16 will energize stepping unit 28 of selector switch 22 to progressively move wiper arms 26a and 26b across their associated contact banks. On the other hand it is clear from inequality (2) that the sum of the voltages applied at input terminals 138, 140 and 142 of control unit 18 will be of positive polarity with respect to ground and, therefore, control unit 18 will prevent energization of stepping unit 52 in selector switch 24.

Assume now that the applied positive analog signal has a magnitude of 42 volts. Immediately upon the energization of stepping unit 28 of selector switch 22 by control unit 16, wiper arms 26a and 26b are moved from their normal positions into engagement with the 0 level contacts in contact banks 23a and 23b, respectively. It follows, therefore, that a potential of −9.5 volts will be applied to wiper arm 26a and thus to input terminal 38 of control unit 16. It is clear from inequality (1), however, that control unit 16 will maintain stepping unit 28 energized, since the algebraic sum of the potential applied to wiper arm 26a and the analog signal voltage remains positive with respect to ground. Accordingly, wiper arms 26a and 26b will be progressively stepped across their respective contact banks, and the potential applied to wiper arm 26a will become progressively more negative with respect to ground.

Consider now the operation of the analog-to-digital converter when wiper arm 26a is stepped into engagement with its associated contact in switch position or level 40. The potential applied to wiper arm 26a is now changed to −49.5 volts, thereby changing the algebraic sum of the analog signal voltage and the potential applied to wiper arm 26a to a potential value which is negative with respect to ground. In accordance with inequality (1), therefore, control unit 16 deenergizes stepping unit 28 and ground potential is applied continuously to utilization device 36 through wiper arm 26b and the conductor connected to the 40 level contact in contact bank 22b.

Consider now the operation of control unit 18 and its associated units digit selector switch 24 prior to and after the time wiper arm 26a of selector switch 22 is stepped to level 40. Prior to this time no potential is applied to wiper arm 54a of selector switch 24, and the sum of the analog signal voltage and the potential applied to wiper arm 26a of selector switch 22 is positive with respect to ground. Accordingly, control unit 18 will maintain stepping unit 52 of selector switch 24 unenergized until selector switch 22 has stepped wiper arm 26a to level 40.

Immediately after wiper arm 26a of selector switch 22 is stepped into engagement with its associated contact at level 40 of contact bank 23a, control unit 18 energizes stepping unit 52 to progressively step wiper arms 54a and 54b of selector switch 24 across their associated contact banks. As wiper arm 54a thereafter is stepped across contact bank 48a, progressively higher positive potentials are applied to the wiper arm and thus to input terminal 140 of control unit 18. Assume now that wiper arm 54a has been stepped to switch level 03. Inserting in inequality (2) the values of the potentials applied at input terminals 138, 140 and 142 of control unit 18, it will be noted that the inequality is still satisfied, or in other words, the algebraic sum of the voltage $$[42+(-49.5+7)=-.5]$$

is still negative with respect to ground. It is clear, however, that as wiper arm 54a is stepped into engagement with its associated contact at switch level 02, the algebraic sum of the voltages applied to control units 18 $[42+(-49.5)+8=+.5]$ changes sign and becomes positive with respect to ground. Thus, inequality (2) is no longer satisfied and stepping unit 52 of selector switch 24 is deenergized by control unit 18.

The conversion of the analog signal is thus completed and connection is made to utilization device 36 over the conductors corresponding to the tens digit four and the units digit two. Clearly, therefore, utilization device 36 will be selectively actuated in strict accordance with the magnitude of the applied analog signal, namely, 42 volts.

It may also be shown that if the applied analog signal has a magnitude which cannot be expressed as an integer, the analog-to-digital converter of the present invention will convert the analog signal to switch positions corresponding to the nearest integer. For example, if the applied analog signal has a magnitude of 84.6 volts, it may be shown that selector switch 22 will step to level 80 corresponding to tens digit eight and that selector switch 24 will step to level 05 corresponding to the nearest units digit five. If, on the other hand, the applied analog signal has a valve of 37.4 volts, it may be shown that selector switches 22 and 24 will step to levels 30 and 07, respectively.

Summarizing the operation of the analog-to-digital converter of this invention, the control unit associated with the higher order or tens selector switch compares the potential generated by the switch with the analog signal and moves the sensing element of the switch until the algebraic sum of the generated potential and the analog signal changes sense with respect to a predetermined voltage level. On the other hand the lower order or units control unit compares the potential generated by the units selector switch with the algebraic sum of the analog signal and the potential generated by the tens selector switch and moves the sensing element of the unit switch until the algebraic sum of the compared potentials changes sense with respect to the predetermined voltage level. It is to be noted that the sensing element of the tens selector switch is energized until the algebraic sum of the potentials applied by the tens control unit changes from a positive sense to a negative sense, whereas the sensing element of the units switch is energized until the algebraic sum of the compared potentials changes from a negative sense to a positive sense.

It should be understood, of course, that the analog-to-digital converter of the present invention also includes suitable release mechanisms, not shown, for returning the selector switches to their normal positions when it is so desired. In addition, it will be clearly recognized that the analog-to-digital converter of this invention may employ more than two selector switch and associated control units, the specific number utilized being determined by the conversion accuracy desired and by the magnitudes of the analog signals to be converted. For example, if it is desired to convert an analog signal which may have an amplitude anywhere between 0 and 1,000 volts to switch positions corresponding to the decimal equivalent of the signal amplitude taken to the nearest unit volt, three selector switches may be utilized to present the hundreds, tens and units digits, respectively. In a similar manner, if it is desired to indicate tenths of a volt by a corresponding switch position, a selector switch and associated contact unit may be provided as a succeeding decade unit to present the tenths indication. Typical connections which would be required from the preceding decades are shown in Fig. 1 by the conductors terminating at bracket 160. When more than two selector switches are utilized, the successive units are arranged to be responsive to opposite senses of the algebraic sum of the compared potentials.

Referring now to Fig. 2 there is shown a schematic diagram of one electrical circuit which has been utilized in control units 16 and 18. It will be noted that the input and output terminals of control units 16 and 18 are designated by the identical reference characters utilized to designate the corresponding terminals in Fig. 1. It is considered, therefore, that further description of the external connections to the control units is unnecessary.

Each of control units 16 and 18 includes a summation network and an associated relay amplifier circuit, the summation networks in control units 16 and 18 being generally designated 200 and 202, respectively, and the relay amplifier circuits being generally designated 204 and 206, respectively.

Summation network 200 includes two impedances, such as resistors 210 and 212, for example, which are connected together at a common junction 214, the other ends of resistors 210 and 212 being connected to input terminals 38 and 42, respectively. The function of summation network 200 is to present at common junction 214 a potential corresponding to the algebraic sum of the voltages applied at input terminals 38 and 42.

Relay amplifier 204 comprises a differential amplifier, including a double triode 216 and a variable resistor 217 in the cathode circuit thereof, and two cascaded resistance-coupled-amplifier circuits which include triodes 218 and 220, respectively. In addition, relay amplifier 204 includes a relay winding 222 in the anode circuit of triode 220, and a set of break-make relay contacts, generally designated 221, which are actuated in accordance with the energization and deenergization of relay winding 222. Contact set 221 includes a back contact 224, a swinger contact 226 connected to a source 230 of direct current potential, and a front contact 228 connected to output terminal 44. Swinger contact 226 is normally held against back contact 224 and is moved into engagement with front contact 228 upon energization of winding 222, thereby connecting source 230 to output terminal 44.

By adjusting variable resistor 217 to the proper value, relay winding 222 will become energized to move its associated swinger contact 226 into engagement with front contact 228 whenever the potential applied at common junction 214 rises above a predetermined voltage level. In a similar manner swinger contact 226 will move to its normal position against its back contact 224 whenever the potential of common junction 214 falls below the predetermined voltage level.

Assume now that variable resistor 217 is adjusted so that winding 222 is energized when the potential of common junction 214 rises above ground potential and is deenergized when the potential of common junction 214 falls below ground potential. It is apparent, then, that an output signal will be presented at output terminal 44 to energize selector switch 22 whenever the sum of the potentials applied at input terminals 38 and 42 is positive with respect to ground. Inasmuch as the operation of relay amplifiers of this type are well known to the art, it is considered that further description of the structure and mode of operation of control unit 16 is unnecessary.

Summation network 202 in control unit 18 is similar to summation network 200 in control unit 16 with the exception that it includes three impedances such as resistors 232, 234 and 236, for example. Each of resistors 232, 234 and 236 is connected to a common junction 238, the other ends of these resistors being connected to input terminals 138, 140 and 142, respectively. The values of these resistors are selected so that the potential at common junction 238 is equal to the algebraic sum of the potentials applied to input terminals 138, 140 and 142.

The component electrical circuits of relay amplifier 206 are identical to the circuits of relay amplifier 204, as set forth above, and include a relay winding 240 and an associated front contact 242, swinger contact 244, and back contact 246. The only significant difference between the structure of relay amplifier 206 and that of relay amplifier 204 is that output terminal 144 is connected to back contact 246 rather than to the associated front contact. Assuming now that relay winding 240 is energized to move swinger contact 244 into engagement with front contact 242 whenever the potential at junction 238 is positive with respect to ground potential and that swinger contact 244 will remain against its back contact 246 whenever the potential at common junction 238 is negative with respect to ground. It is clear, therefore, that an output signal will appear at output terminal 144 to energize selector switch 24 only when the algebraic sum of the potentials applied at input terminals 138, 140 and 142 of control unit 18 is negative with respect to ground.

It will be recognized by those skilled in the art, of course, that other electronic circuits may be utilized in the control units of the analog-to-digital converter of the present invention and that the use of relay amplifiers in the control units, as illustrated in Fig. 2, is not to be construed as limiting the invention.

What is claimed as new is:

1. An analog-to-digital device for converting the amplitude of a direct-current electrical input signal of a predetermined polarity into a sequence of digits which constitutes a number representative of said amplitude, said device comprising a first voltage divider corresponding to a major decimal decade of said number, said first voltage divider having one extremity thereof connected to ground and having first, second, third, fourth, fifth, sixth, seventh, eighth, ninth and tenth uniformly spaced taps commencing from said one extremity and corresponding, respectively, to the integers 0, 1, 2, 3, 4, 5, 6, 7, 8, and 9; means for applying a first direct-current voltage of a polarity opposite to said predetermined polarity to the remaining extremity of said first voltage divider, said first direct-current voltage being of a magnitude to produce potentials greater than $(p+0.9)10^n$ volts and less than $(p+1.0)10^n$ volts at each of said first, second, third, fourth, fifth, sixth, seventh, eighth, ninth and tenth taps thereof where $p$ is an integer which successively corresponds to each of said taps and $n$ is an integer that defines said major decimal decade; a second voltage divider corresponding to a decimal decade that is adjacent to and lesser than said major decimal decade of said number, said second voltage divider having one extremity thereof connected to ground and first, second, third, fourth, fifth, sixth, seventh, eighth, ninth and tenth uniformly spaced taps commencing from said one extremity and corresponding, respectively, to integers 9, 8, 7, 6, 5, 4, 3, 2, 1 and 0; means for applying a second direct-current voltage of a polarity the same as said predetermined polarity to the remaining extremity of said second voltage divider, said second direct-current voltage being of a magnitude to produce a potential substantially equal to $(10-q)10^{n-1}$ at each of said first, second, third, fourth, fifth, sixth, seventh, eighth, ninth and tenth taps thereof, where $q$ is an integer which successively corresponds to each of said taps of said second voltage divider; first and second switches having first and second movable contact arms, respectively, for engaging and disengaging said voltage taps of said first and second voltage dividers, said first and second movable contact arms being normally disengaged from the first of said voltage taps thereof; a first control means responsive to said input signal and the voltage available at said first movable contact arm for actuating said first switch thereby to move said first arm into engagement with the tap of said first voltage divider to which the lowest voltage of greater absolute magnitude than the amplitude of said direct-current electrical input signal is applied; and second control means responsive to said electrical input signal, the voltage appearing at the tap of said first voltage divider engaged by said first arm and the voltage appearing at the tap of said second voltage divider engaged by said second arm for actuating said second switch thereby to move said second arm to the lowest numbered tap of said second voltage divider at which the algebraic sum of the input voltages to said second control means is of said predetermined polarity, whereby the integers corresponding to the respective taps of said first and second voltages dividers that are engaged by said first and second arms, respectively, constitute successive digits of said number.

2. The analog-to-digital device as defined in claim 1 wherein said first direct-current voltage is of a magnitude to produce potentials substantially equal to $(p+0.95)10^n$ volts at each of said first, second, third, fourth, fifth, sixth, seventh, eighth, ninth and tenth taps of said first voltage divider.

References Cited in the file of this patent

UNITED STATES PATENTS

| | | |
|---|---|---|
| 2,454,809 | Kruithof | Nov. 30, 1948 |
| 2,497,961 | Shaw | Feb. 21, 1950 |
| 2,547,035 | McWhirter et al. | Apr. 3, 1951 |
| 2,611,538 | Hatton | Sept. 23, 1952 |
| 2,625,822 | Nichols | Jan. 20, 1953 |
| 2,640,883 | Buchner | June 2, 1953 |
| 2,641,522 | King | June 9, 1953 |
| 2,676,210 | Oberman | Apr. 20, 1954 |
| 2,691,121 | Buchner | Oct. 5, 1954 |
| 2,700,076 | Goode | Jan. 18, 1955 |
| 2,715,724 | Oberman | Aug. 16, 1955 |
| 2,775,754 | Sink | Dec. 25, 1956 |

UNITED STATES PATENT OFFICE

CERTIFICATE OF CORRECTION

Patent No. 2,896,198 July 21, 1959

Robert Royce Bennett

It is hereby certified that error appears in the printed specification of the above numbered patent requiring correction and that the said Letters Patent should read as corrected below.

Column 3, line 51, for "conected" read -- connected --; column 5, line 20, after the symbol (+) insert italized - Y-; column 6, line 64, for "valve" read -- value --; column 10, line 13, for "voltages" read -- voltage --.

Signed and sealed this 8th day of December 1959.

(SEAL)

Attest:

KARL H. AXLINE

Attesting Officer

ROBERT C. WATSON

Commissioner of Patents